(12) United States Patent
Nagamine et al.

(10) Patent No.: US 8,435,596 B2
(45) Date of Patent: May 7, 2013

(54) OXIDIZING METHOD AND OXIDIZING APPARATUS

(75) Inventors: Yoshinori Nagamine, Fuchu (JP); Naoki Watanabe, Nishitokyo (JP)

(73) Assignee: Canon Anelva Corporation, Kanagawa-Ken (JP)

( * ) Notice: Subject to any disclaimer, the term of this patent is extended or adjusted under 35 U.S.C. 154(b) by 0 days.

(21) Appl. No.: 13/530,825

(22) Filed: Jun. 22, 2012

(65) Prior Publication Data

US 2012/0270412 A1     Oct. 25, 2012

Related U.S. Application Data

(60) Division of application No. 12/201,630, filed on Aug. 29, 2008, which is a continuation of application No. PCT/JP2008/051753, filed on Feb. 4, 2008.

(30) Foreign Application Priority Data

Feb. 9, 2007   (JP) .................................. 2007-030056

(51) Int. Cl.
  *C23C 16/00* (2006.01)
  *H01L 21/31* (2006.01)
(52) U.S. Cl.
  USPC ........................... 427/132; 427/127; 427/569
(58) Field of Classification Search .................. None
  See application file for complete search history.

(56) References Cited

U.S. PATENT DOCUMENTS

| | | | |
|---|---|---|---|
| 4,828,369 A | 5/1989 | Hotomi | |
| 4,950,376 A * | 8/1990 | Hayashi et al. | 204/192.32 |
| 5,472,508 A | 12/1995 | Saxena | |
| 5,518,572 A | 5/1996 | Kinoshita et al. | |
| 6,162,323 A | 12/2000 | Koshimizu | |
| 6,217,703 B1 | 4/2001 | Kitagawa | |
| 6,830,786 B2 | 12/2004 | Yuda et al. | |
| 6,856,916 B2 | 2/2005 | Shyu | |

(Continued)

FOREIGN PATENT DOCUMENTS

| | | |
|---|---|---|
| JP | 58212128 A | 12/1983 |
| JP | 63-286570 A | 11/1988 |

(Continued)

OTHER PUBLICATIONS

Ando, J. Phys. D: Applied Physics, V35, p. 2415, Sep. 2002.*

(Continued)

*Primary Examiner* — Joseph Miller, Jr.
(74) *Attorney, Agent, or Firm* — Buchanan Ingersoll & Rooney PC (57) ABSTRACT

An oxidizing method and oxidizing apparatus in which a plasma generating chamber having an oxidizing gas supply port and a substrate processing chamber having an exhaust port and internally having a substrate susceptor are connected via a partition having a number of through holes, a plasma of an oxidizing gas supplied into the plasma generating chamber is generated, and an oxide layer is formed on a substrate surface by supplying the generated active species onto a substrate are characterized in that the partition is connected to a power supply via a switching mechanism such that a positive, negative, or zero voltage is applied to the partition, and an oxidation process is performed by changing the ratio of radicals, positive ions, and negative ions in the active species supplied onto the substrate by switching the voltages at least once during the oxidation process.

1 Claim, 6 Drawing Sheets

U.S. PATENT DOCUMENTS

| | | |
|---|---|---|
| 6,886,491 B2 | 5/2005 | Kim et al. |
| 2002/0000202 A1 | 1/2002 | Yuda et al. |
| 2004/0244687 A1 | 12/2004 | Ichiki et al. |
| 2004/0257865 A1* | 12/2004 | Honjo et al. .................. 365/171 |

FOREIGN PATENT DOCUMENTS

| | | |
|---|---|---|
| JP | 2-192489 A | 7/1990 |
| JP | 05175172 A | 7/1993 |
| JP | 05275350 A | 10/1993 |
| JP | 5-326452 A | 12/1993 |
| JP | 7-263353 | 10/1995 |
| JP | 2000-36628 A | 2/2000 |
| JP | 2001-57450 A | 2/2001 |
| JP | 3159097 B2 | 2/2001 |

OTHER PUBLICATIONS

PCT/ISA/210.

PCT/ISA/237.

Notification of the First Office Action issued in the corresponding Chinese Patent Application No. 200880000094.5 dated May 12, 2010, and an English Translation thereof.

Office Action dated Sep. 6, 2011, issued in the corresponding Taiwanese Patent Application No. 097104640, and an English Translation thereof.

Japanese Office Action issued in corresponding Japanese Patent Application No. 2008-532935, dated Apr. 16, 2012, and English translation thereof.

* cited by examiner

OXIDIZING METHOD AND OXIDIZING APPARATUS

This is a Division of application Ser. No. 12/201,630 filed on Aug. 29, 2008, which is a Continuation of PCT/JP2008/051753 filed on Feb. 4, 2008, which claims the benefit of Japanese Application No. 2007-030056 filed on Feb. 9, 2007. The disclosures of the prior applications are hereby incorporated by reference herein in their entireties.

TECHNICAL FIELD

The present invention relates to an oxidizing method and oxidizing apparatus and, more particularly, to an oxidizing method and oxidizing apparatus used to form a very thin oxide layer, such as a tunnel barrier film of, for example, a tunnel magnetoresistive effect (TMR) element for use in a magnetic head or MRAM, or a capacitive insulating film of a MOSFET (metal-oxide-semiconductor field-effect transistor).

BACKGROUND ART

As a method of forming an oxide film, such as a tunnel barrier layer of a TMR multilayered film, required to have a very small uniform film thickness of about 0.5 to 2 nm, a method of forming a thin metal film having a predetermined film thickness and forming a barrier layer having a desired thickness by oxidizing the metal film is adopted. Since the magnetoresistance change rate and junction resistance of the TMR multilayered film fluctuate in accordance with, for example, the barrier layer formation method and film quality, various oxidizing methods capable of increasing the magnetoresistance change rate and decreasing the junction resistance have been studied.

In Japanese Patent Laid-Open No. 2001-57450, for example, a nonmagnetic metal oxide layer in a TMR multilayered film including a first ferromagnetic layer/nonmagnetic metal oxide layer (barrier layer)/second ferromagnetic layer is formed by forming a thin metal film and performing plasma oxidation, natural oxidation, or radical oxidation, and the magnetoresistance change rates, the junction resistances, and the like of the obtained TMR multilayered films are compared and examined.

Consequently, in plasma oxidation in which the thin metal film is exposed to a plasma, the oxidation rate is very high, and even the ferromagnetic layer positioned below the barrier layer suffers oxidation damage. This reveals the problem that it is not easy to stably form a multilayered film having a low resistance value. To avoid this problem, Japanese Patent Laid-Open No. 2000-36628 has disclosed a barrier layer formation method that repeats the formation of a thin metal film and plasma oxidation twice or more. Unfortunately, this method has the problem that the number of manufacturing steps increases and the productivity decreases. Also, the natural oxidation method makes it possible to obtain a resistance two orders of magnitude or more lower than that obtained by the plasma oxidation method, but has the problems that the productivity decreases because an oxidation time of 60 min or more is necessary, and an unoxidized portion that significantly deteriorates the TMR characteristics readily forms.

On the other hand, compared to the natural oxidation method, radical oxidation has the advantage that although the junction resistance increases, the productivity increases and a high resistance change rate can be obtained. Also, compared to the plasma oxidation method, radical oxidation has the advantage that a high-performance TMR multilayered film can be stably produced.

Unfortunately, the radical oxidation method is still unsatisfactory and has its limit in order to further decrease the junction resistance and further increase the resistance change rate. That is, the radical oxidation method has an oxidizing power higher than that of the natural oxidation method, but this oxidizing power is still insufficient. As a consequence, an unoxidized portion sometimes forms, and this makes it difficult to improve the characteristics of the TMR multilayered film.

Instead of the oxidation methods described above, it is also possible to perform oxidation by using an oxygen ion beam by applying an apparatus disclosed in, for example, Japanese Patent No. 3159097. In this method, a plasma chamber for generating a plasma and a processing chamber containing a substrate are coupled via a mesh-like extracting electrode, an ion beam is extracted from the plasma by applying a voltage to the extracting electrode, and the substrate surface is oxidized by this ion beam. In a processing apparatus like this, however, the ion beam oxidizing apparatus using the mesh-like partition cannot sufficiently isolate the plasma, and inflicts damage to the oxide film as in plasma oxidation. This makes a TMR multilayered film having stable characteristics impossible to obtain.

DISCLOSURE OF INVENTION

Problems to be Solved by the Invention

Under the circumstances, the present inventor examined various oxidation methods and the conditions of the methods, and has found that a multilayered film having a low junction resistance and high resistance change rate is obtained by using a thick extracting electrode instead of the mesh electrode described above, and performing ion beam oxidation after radical oxidation. The present invention is completed by further adding examination to these findings, and has as its object to provide an oxidizing method and oxidizing apparatus capable of forming an oxide film having a desired film quality and thickness by reducing plasma damage and making the oxidation rate controllable.

Means for Solving the Problems

An oxidizing method of the present invention is an oxidizing method of forming an oxide layer on a substrate surface by supplying, onto a substrate, an active species of radicals, positive ions, or negative ions in an oxidizing gas plasma, characterized by performing an oxidation process by setting the radicals, positive ions, and negative ions in the active species supplied onto the substrate at a predetermined ratio, and further performing an oxidation process by changing the ratio.

Also, an oxidizing method of forming an oxide layer on a substrate surface by connecting a plasma generating chamber and a substrate processing chamber via a partition having a number of through holes, generating a plasma by supplying an oxidizing gas into the plasma generating chamber, and supplying a generated active species onto a substrate in the substrate processing chamber is characterized by performing an oxidation process by applying one of three kinds of voltages, that is, a positive voltage, a negative voltage, and a zero voltage to the partition, and further performing an oxidation process by applying another one of the voltages.

For example, the ratio of an active species contributing to oxidation can be changed (i.e., the ratio of radicals, positive ions, and negative ions can be changed) by setting the potential of the partition at a positive potential, zero (ground) potential, or negative potential. Consequently, an optimum species can be selected in accordance with the required film quality and film thickness. That is, when oxygen gas is used as the oxidizing gas and the partition is grounded, electrically neutral oxygen radicals are supplied to the substrate surface by the pressure difference between the plasma generating chamber and substrate processing chamber, so radical oxidation is mainly performed. When the potential of the partition is set at a predetermined negative or positive value, $O^+$ ions or $O^-$ ions are respectively extracted by an electric field, so ion oxidation is additionally performed.

Effects of the Invention

Accordingly, it is possible to perform a plurality of oxidation processes, that is, radical oxidation and ion beam oxidation using positive or negative ions in the same chamber. For example, a TMR multi layered film having a high resistance change rate and low junction resistance can be formed by performing oxygen radical oxidation on a thin metal film, and then forming a tunnel barrier layer by positive ion beam oxidation.

The present invention is preferably applied to the case where the substrate surface is a metal film, particularly, a very thin metal film about 0.5 to 10 nm thick.

An oxidizing apparatus of the present invention is an oxidizing apparatus in which a plasma generating chamber having an oxidizing gas supply port and a substrate processing chamber having an exhaust port and internally having a substrate susceptor are connected via a partition having a number of through holes, a plasma of an oxidizing gas supplied into the plasma generating chamber is generated, and an oxide layer is formed on a substrate surface by supplying the generated active species onto a substrate, characterized in that the partition is connected to a power supply via a switching mechanism such that a positive, negative, or zero voltage is applied to the partition, and the voltages are switched at least once during an oxidation process.

Since not a mesh-like electrode but a thick (e.g., 3- to 20-mm thick) partition having through holes is used as the ion extracting electrode, the plasma can be reliably isolated in the plasma generating chamber, so the substrate is not directly exposed to the plasma. Also, since the through hole in the partition has a certain length, ions flying obliquely to the partition are entrapped in the partition, and only ions perpendicularly passing through the partition arrive at the substrate and contribute to oxidation. Accordingly, overoxidation caused by a high oxidation rate can be prevented unlike when the mesh-like extracting electrode is used.

The present invention makes it possible to obtain an oxide film having characteristics unobtainable by any conventional method, by adjusting the ratio of positive ions, negative ions, and radicals in an active species to be supplied onto a substrate, and successively performing processing mainly using ion oxidation and processing mainly using radical oxidation. For example, the present invention can provide a high-performance TMR multilayered film.

That is, the present invention makes it possible to select a formation method optimum for the required film quality for various oxide films, thereby stably producing high-performance films.

BRIEF DESCRIPTION OF DRAWINGS

The accompanying drawings, which are incorporated in and constitute a part of the specification, illustrate embodiments of the invention, and together with the description of the embodiments, serve to explain the principles of the invention.

BEST MODE FOR CARRYING OUT THE INVENTION

Preferred embodiments of the present invention will be exemplarily explained in detail below with reference to the accompanying drawings. However, constituent elements described in the embodiments are merely examples, and the technical scope of the present invention is determined by the scope of the appended claims and is not limited by the individual embodiments explained below.

Figure 1:
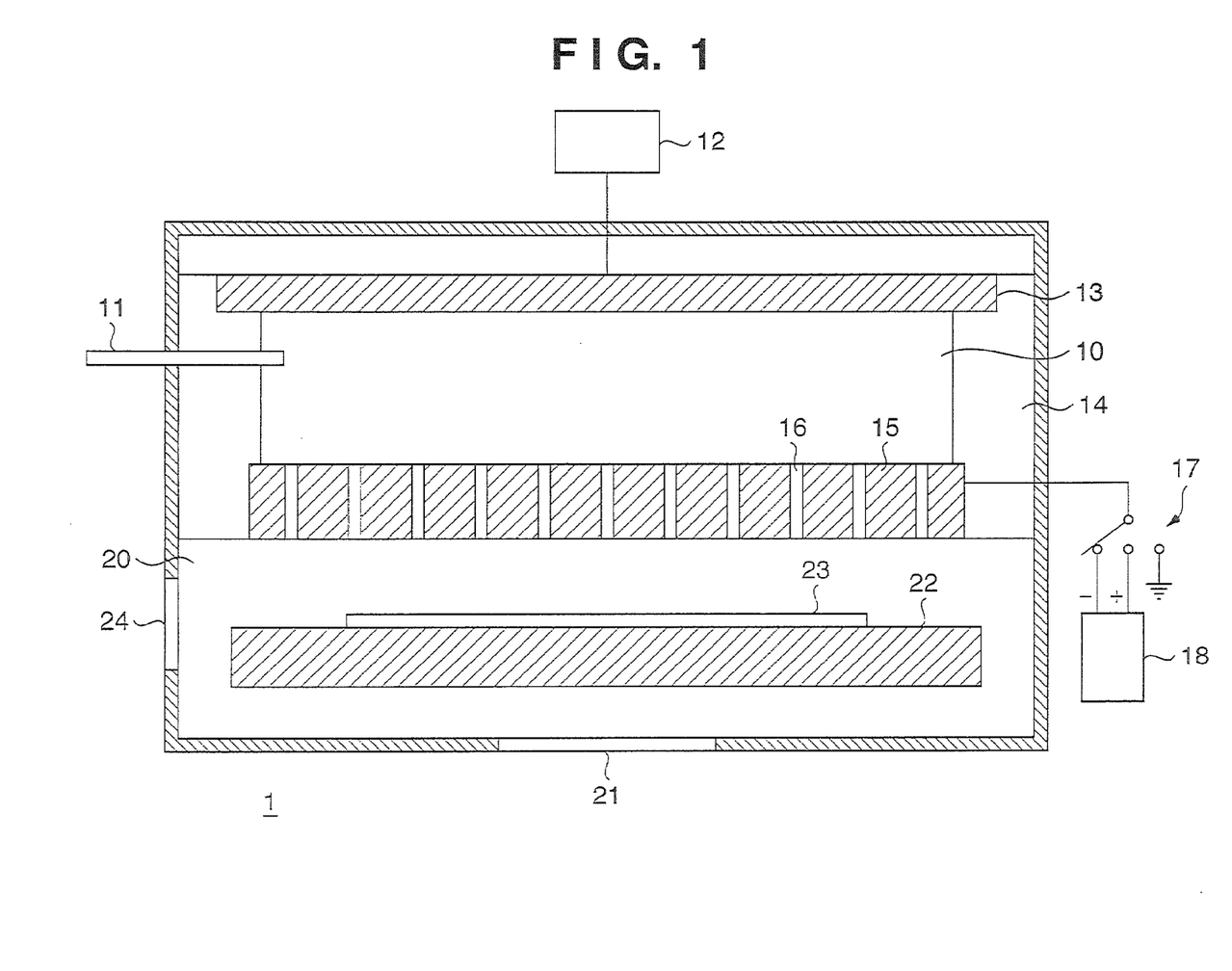
FIG. 1 is an exemplary sectional view showing an example of an oxidizing apparatus of the present invention.
Figure 2:
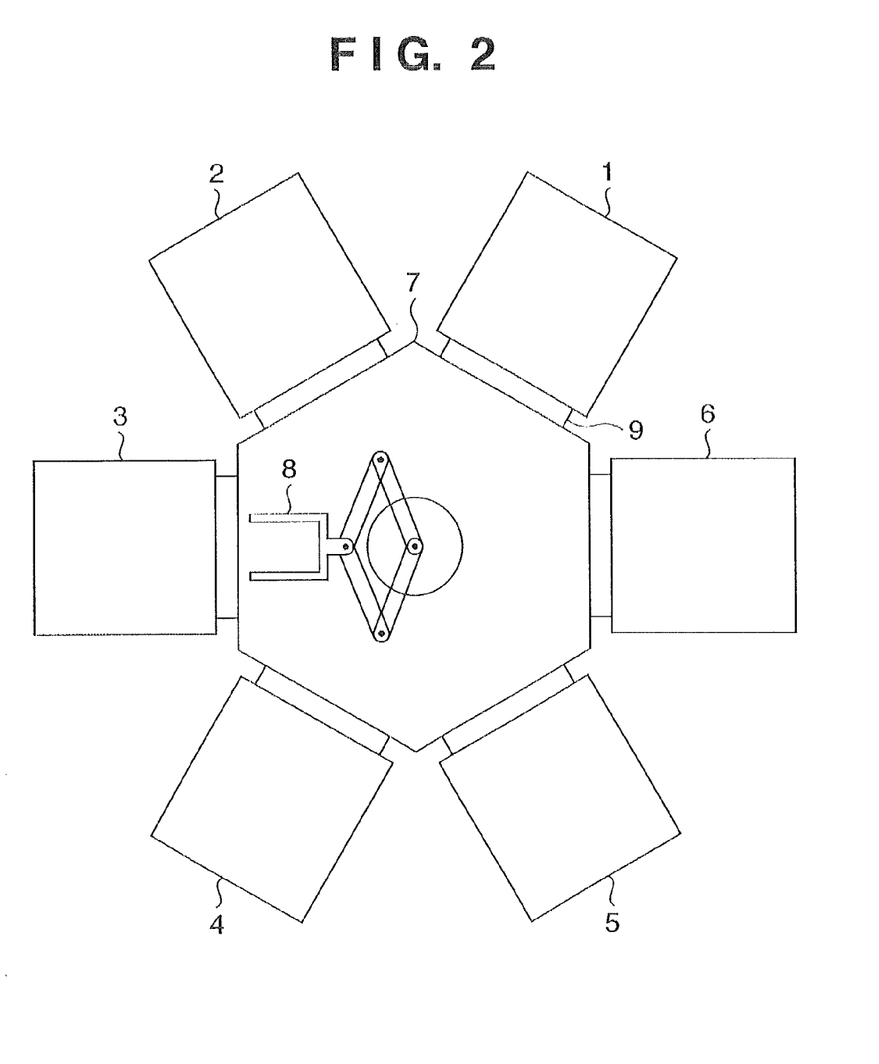
FIG. 2 is an exemplary view showing an example of the arrangement of a TMR multilayered film manufacturing apparatus.
Figure 3:
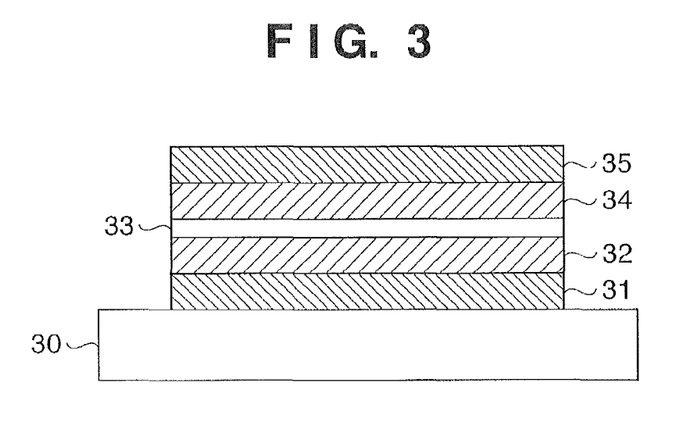
FIG. 3 is an exemplary view showing the structure of a TMR multilayered film.

FIG. 2 is an exemplary view showing an example of an apparatus for manufacturing a TMR multilayered film shown in FIG. 3. FIG. 1 is an exemplary sectional view showing an example of an oxidizing apparatus for use in the formation of a tunnel barrier layer.

The apparatus for manufacturing a TMR multilayered film is a cluster type manufacturing apparatus in which a sputtering apparatus 4 for forming electrode layers 31 and 35, a sputtering apparatus 5 for forming a first ferromagnetic layer 32, a sputtering apparatus 6 for forming a metal film, an oxidizing apparatus 1 for oxidizing the metal film, a sputtering apparatus 2 for forming a second ferromagnetic layer 34, and a load lock chamber 3 are attached, via gate valves 9, around a transfer chamber 7 containing a robot 8.

The metal film oxidizing apparatus 1 shown in FIG. 2 comprises a plasma generating chamber 10 and substrate processing chamber 20, and is partitioned by a partition 15 having a number of through holes 16 and fixed to the chamber walls with insulating stones 14 being interposed between them. The partition 15 is connected to the positive or negative terminal of a DC power supply 18 or to a ground terminal via a switch 17, so as to be connected to a positive, negative, or zero potential. The thickness and the number and diameter of the through holes of the partition 15 are set such that the plasma does not ooze out into the substrate processing chamber 20. For example, the thickness is preferably 3 to 20 mm (more preferably 5 to 10 mm), and the hole diameter is preferably 1 to 10 mm.

An upper electrode 13 coupled to a radio-frequency power supply 12 is installed in the plasma generating chamber 10, and an oxygen gas supply pipe 11 connected to an oxygen gas supply system (not shown) is attached to the plasma generating chamber 10. On the other hand, an exhaust port 21 is formed in the substrate processing chamber 20, and connected to an exhaust device (not shown). A substrate susceptor 22 for holding a substrate 23 is installed in the substrate processing chamber 20. The substrate susceptor 22 need only be grounded or set at a floating potential. For example, the distance between the partition and substrate is desirably about 20 to 100 mm. This makes the difference between the effects of radical oxidation and ion beam oxidation more conspicuous.

The procedure of forming a TMR multilayered film having the structure shown in FIG. 3 will be explained below with reference to FIGS. 1 and 2. First, a cassette containing a substrate 30 is loaded into the load lock chamber 3, and the load lock chamber 3 is evacuated. After that, the gate valve is opened, the robot 8 unloads the substrate and transfers it to the sputtering apparatus 4, and a Cu electrode layer 31 is formed. Subsequently, the substrate is transferred to the sputtering apparatus 5, and a first ferromagnetic layer 32 about 20 nm thick made of, for example, $Fe_{70}Co_{30}$ is formed. The substrate is then transferred to the sputtering apparatus 6, and a thin metal film about, for example, 1 nm thick made of Al or the like is formed. Subsequently, the substrate 30 is transferred to the oxidizing apparatus 1, and the Al film is oxidized by the following procedure.

When the substrate 23 on which the Al film having a predetermined thickness is formed on the first ferromagnetic layer 32 is placed on the substrate susceptor 22 through a loading/unloading port 24, the gate valve 9 of the loading/unloading port 24 is closed, and the exhaust device (not shown) evacuates the oxidizing apparatus 1 to a predetermined vacuum degree. The oxygen gas supply system then supplies an oxygen gas at a predetermined flow rate to the plasma generating chamber 10 through the gas supply pipe 11, and the interior of the plasma generating chamber 10 is set at a predetermined pressure by adjusting a valve attached to the exhaust port. The diameter, number, and the like of the through holes formed in the partition determine the pressure difference between the plasma generating chamber 10 and substrate processing chamber 20. After that, the partition 15 is grounded by the switch 17, and a plasma is generated by applying radio-frequency power to the upper electrode 13 from the external radio-frequency power supply 12.

The partition 15 prevents the plasma from oozing out into the substrate processing chamber 20. Also, oxygen radicals in the active species generated by the plasma are mainly supplied onto the substrate by using the pressure difference between the plasma generating chamber 10 and substrate processing chamber 20 as a propulsive force, and an oxide layer is principally formed by radical oxidation. When a predetermined time has elapsed, the switch 17 is closed to the output terminal of the DC power supply to continue the oxidation process. Oxygen ions in the plasma are extracted by applying a negative voltage to the partition, and ions having energy equivalent to the applied voltage are incident on the substrate, thereby forming an oxide layer 33 by an oxidation process that superposes ion beam oxidation on radical oxidation. When a predetermined time has elapsed, the radio-frequency power is shut off to stop discharge and stop the supply of the oxygen gas.

After the substrate processing chamber 20 is evacuated to a predetermined vacuum degree, the gate valve 9 is opened, the substrate 23 is transferred to the sputtering apparatus 2, and a second ferromagnetic layer 34 made of, for example, $Fe_{50}Co_{50}$ is formed. Subsequently, an electrode layer 35 is formed in the electrode sputtering chamber 4. After that, the substrate 23 is returned to the load lock chamber 3.

As described above, a number of substrates are sequentially transferred to the individual apparatuses at the same time, and the different processes are simultaneously performed in these apparatuses, thereby producing TMR multilayered films with a high throughput. Also, the TMR multilayered film formed by the above processes makes it possible to decrease the junction resistance and increase the resistance change rate, compared to a TMR multilayered film formed by conventional plasma oxidation alone.

Note that a single layer is used as each of the first and second ferromagnetic layers in the above embodiment, but a stacked structure made of, for example, CoFe/Ru/CoFe may also be used. In this case, it is only necessary to use a manufacturing apparatus in which sputtering apparatuses are appropriately arranged in accordance with the number of layers. As the metal film, it is also possible to use, for example, Ta, Gd, Mg, Mo, Ti, or W, instead of Al. Furthermore, in the present invention, it is possible to use not only the cluster type manufacturing apparatus, but also an inline type manufacturing apparatus in which apparatuses including an oxidizing apparatus are arranged straight (or in the form of a ring).

Note also that in the above embodiment, different oxidation processes are successively performed by switching the voltages of the partition without stopping the plasma. However, it is also possible to stop the plasma once, and generate the plasma again after switching the potentials of the partition. Two kinds of oxidation processes may also be performed in different oxidizing apparatuses.

In addition, although the DC power supply is used as the means for applying a positive or negative voltage to the partition of the oxidizing apparatus, a radio-frequency power supply may also be used. When performing ion beam oxidation, it is also possible to connect a radio-frequency power supply or DC power supply for plasma generation to the partition, and ground the upper electrode, thereby extracting ions onto the substrate. In this case, however, the shape and number of the through holes in the partition must be adjusted so as not to generate a plasma in the substrate processing chamber.

Likewise, although the DC power supply is used as the means for applying a positive or negative voltage to the partition of the oxidizing apparatus, an AC power supply may also be connected to the partition. When electric power is input by thus connecting the AC power supply to the partition, the partition is given a negative potential, so oxygen ions can be selectively extracted. In this case, a matching circuit is preferably inserted between the power supply and partition.

Furthermore, the potential of the partition is set at only a positive, zero (ground), or negative potential in the above embodiment, but the partition potential can be set at any arbitrary voltage level. For example, the voltage level of the partition can be freely changed by coupling a DC power supply to the partition, and manipulating the input power of this DC power supply. The flying energy (the kinetic energy of a flow to the substrate) of ions to be extracted can be adjusted by changing the voltage level. That is, the oxidation rate can be manipulated.

Another arrangement of the oxidizing apparatus will be explained below with reference to FIG. 4. An oxidizing apparatus 1 shown in FIG. 4 is an embodiment in which the shape of insulating stones 14 formed on the inner walls of the vessel of the oxidizing apparatus 1 is different from that of the oxidizing apparatus 1 shown in FIG. 1.

Figure 4:
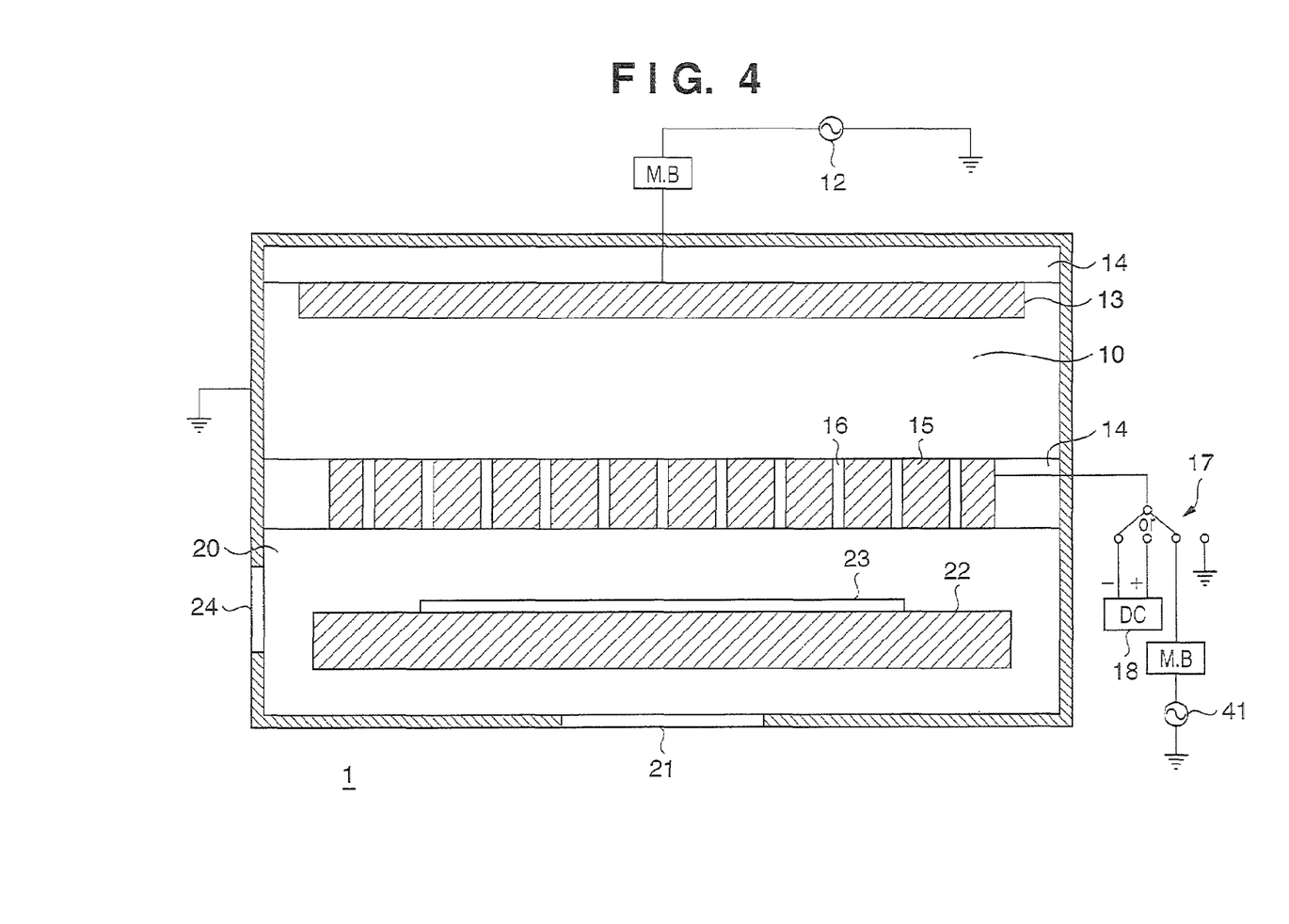
FIG. 4 is an exemplary sectional view showing another form of the oxidizing apparatus of the present invention.

As shown in FIG. 4, an insulating stone 14 is formed between an upper electrode 13 and the inner wall of the oxidizing apparatus 1. In addition, insulating stones 14 are formed between a partition 15 and the inner walls of the oxidizing apparatus 1 so as to support the partition 15. In this manner, a plasma generating chamber 10 is surrounded by the inner walls of the grounded oxidizing apparatus 1. The upper electrode 13 is connected to a radio-frequency power supply 12 via a matching box. The partition 15 is connected via a switch 17 to the positive and negative terminals of a DC power supply 18, to a ground terminal, or to an AC power supply (radio-frequency power supply) 41 via a matching box (M.B).

An oxidizing method using the oxidizing apparatus 1 shown in FIG. 4 will be explained below. As in the embodiment described above, oxygen radicals in an active species generated by a plasma are mainly supplied onto a substrate 23 by using the pressure difference between the plasma generating chamber 10 and a substrate processing chamber 20 as a propulsive force, and an oxide layer is principally formed by radical oxidation. When a predetermined time has elapsed, the oxidation process is continued by closing the switch 17 to the negative output terminal of the DC power supply 18. In this case, the plasma potential is determined based on the wall of the ground. The potential difference between the ground and plasma potential accelerates positive oxygen ions.

When the switch 17 is closed to the terminal of the AC power supply (radio-frequency power supply) 41 after the elapse of the predetermined time, a self bias Vdc is generated on the partition 15, so the partition 15 is given a negative potential. This negative potential accelerates the positive oxygen ions. An oxide layer 33 is formed by an oxidation process that superposes ion beam oxidation on radical oxidation. When a predetermined time has elapsed, the radio-frequency power is shut off to stop discharge and stop the supply of the oxygen gas.

Figure 5:
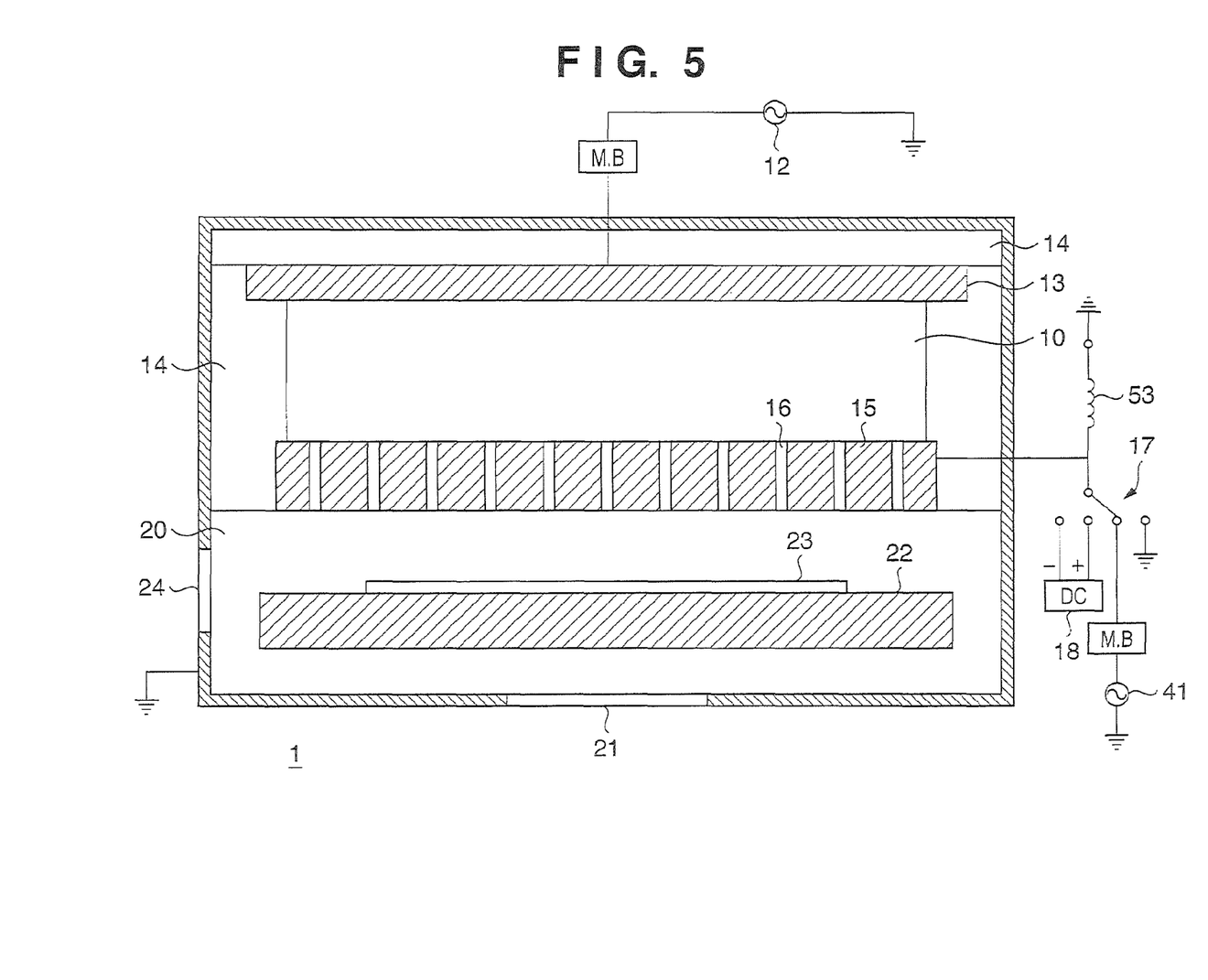
FIG. 5 is an exemplary sectional view showing still another form of the oxidizing apparatus of the present invention.

FIG. 5 shows the state in which a plasma generating chamber 10 is surrounded by insulating stones 14 as in the oxidizing apparatus 1 shown in FIG. 1. However, a partition 15 is grounded via a coil 53 unlike in the oxidizing apparatus 1 shown in FIG. 1. The partition 15 is connected via a switch 17 to the positive and negative terminals of a DC power supply 18, to a ground terminal, or to an AC power supply (radio-frequency power supply) 41 via a matching box (M.B). The oxidizing apparatus 1 is connected to ground.

An oxidizing method using an oxidizing apparatus 1 shown in FIG. 5 will be explained below. As in the embodiment described above, oxygen radicals in an active species generated by a plasma are mainly supplied onto a substrate by using the pressure difference between the plasma generating chamber 10 and a substrate processing chamber 20 as a propulsive force, and an oxide layer is principally formed by radical oxidation. When a predetermined time has elapsed, the oxidation process is continued by closing the switch 17 to the AC power supply 41. In this case, the plasma potential is determined based on the potential of the partition 15. The partition 15 is grounded via the coil 53. Since the coil 53 (a high impedance) is inserted, the DC power is consumed by the ground, and the RF power is consumed by the partition 15, thereby generating a self bias Vdc on the partition 15. The potential difference between the ground and plasma potential accelerates positive oxygen ions. An oxide layer 33 is thus formed by an oxidation process that superposes ion beam oxidation on radical oxidation. When a predetermined time has elapsed, the radio-frequency power is shut off to stop discharge and stop the supply of the oxygen gas.

Figure 6:
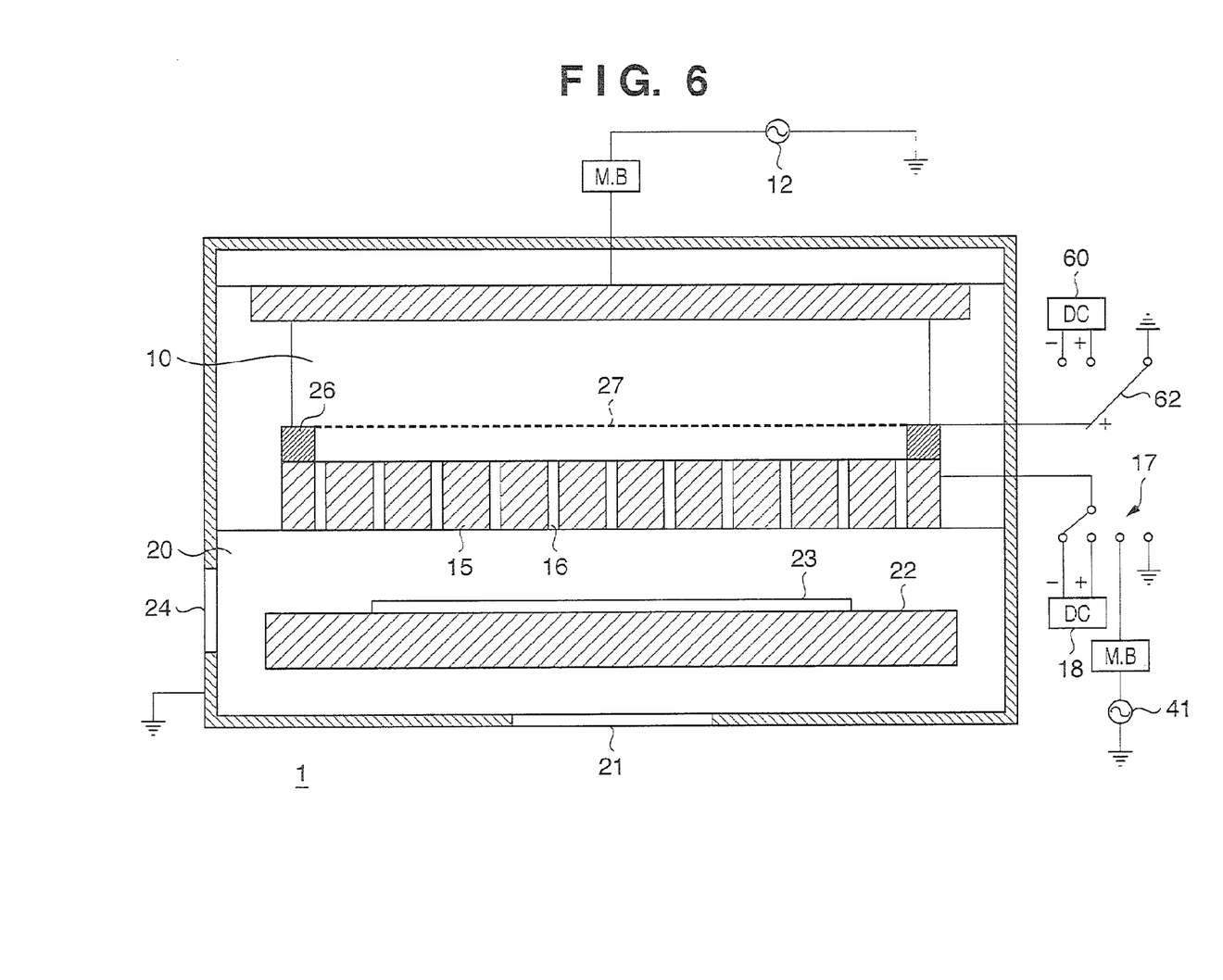
FIG. 6 is an exemplary sectional view showing still another form of the oxidizing apparatus of the present invention.

Still another arrangement of the oxidizing apparatus will be explained with reference to FIG. 6. Unlike the oxidizing apparatus 1 shown in FIG. 1, an extracting electrode 27 for extracting ions is installed above a partition 15 in an oxidizing apparatus 1 shown in FIG. 6. An insulator 26 for insulating the partition 15 and extracting electrode 27 is formed between them. The extracting electrode 27 can be connected to the positive or negative terminal of a DC power supply 60 or a ground terminal via a switch 62. The extracting electrode 27 has a grid structure. Through holes in the partition 15 and holes of the grid are preferably aligned.

An oxidizing method using the oxidizing apparatus 1 shown in FIG. 6 will be explained below. As in the embodiment described above, oxygen radicals in an active species generated by a plasma are mainly supplied onto a substrate by using the pressure difference between a plasma generating chamber 10 and substrate processing chamber 20 as a propulsive force, and an oxide layer is principally formed by radical oxidation. In this radical oxidation, both a switch 17 and the switch 62 are connected to the ground terminals. When a predetermined time has elapsed, the oxidation process is continued by switching to the positive output terminal of the DC power supply 60, and closing the switch 17 to the negative terminal of a DC power supply 18. In this case, the plasma potential is raised by applying a positive bias to the partition 15. Since the potential difference between the ground and plasma potential can be increased, positive oxygen ions can be accelerated. Ions having directivity are incident on the substrate, and an oxidation process that superposes ion beam oxidation on radical oxidation is performed, thereby forming an oxide layer 33. When a predetermined time has elapsed, the radio-frequency power is shut off to stop discharge and stop the supply of the oxygen gas.

In the present invention, the oxidizing gas is a gas such as $O_2$ or $O_3$, or a gas mixture of $O_2$, $O_3$, or the like and, for example, $N_2$.

The tunnel barrier layer of the TMR multilayered film has been described above. However, the present invention is not limited to this layer and applicable to the formation of various oxide layers such as a NOL (nano oxide layer) film in a GMR (Giant MagnetoResistive element) film, and a capacitive insulating film of a MOSFET (metal-oxide-semiconductor field-effect transistor). Although the preferred embodiments of the present invention have been explained with reference to the accompanying drawings, the present invention is not limited to these embodiments and can be changed into various forms within the technical scope understood from the description of the scope of the appended claims.

The present invention is not limited to the above embodiments, and various changes and modifications can be made without departing from the spirit and scope of the invention. To apprise the public of the scope of the present invention, therefore, the following claims are made.

The invention claimed is:

1. A method for manufacturing a tunnel magnetoresistive effect multilayered film element, the method comprising:
   forming a magnetic layer;
   forming a metal film on the magnetic layer; and
   forming a tunnel barrier layer by performing an oxidation process to the metal film using a processing apparatus having a partition between a plasma generating chamber and a substrate processing chamber, the oxidation process comprising:
     a step of performing a first oxidation process by using an active species mainly containing radicals by applying a zero voltage to the partition; and then
     a step of performing a second oxidation process by using an active species mainly containing positive ions by applying a negative voltage to the partition.

* * * * *